(12) United States Patent
Reed et al.

(10) Patent No.: US 6,288,418 B1
(45) Date of Patent: Sep. 11, 2001

(54) MULTIUSE INPUT/OUTPUT CONNECTOR ARRANGEMENT FOR GRAPHICS ACCELERATOR INTEGRATED CIRCUIT

(75) Inventors: David G. Reed, Santa Clara; Rick M. Iwamoto, Cupertino, both of CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 09/273,012

(22) Filed: Mar. 19, 1999

(51) Int. Cl.[7] .................................................. H01L 27/10
(52) U.S. Cl. ........................ 257/209; 257/693; 361/686
(58) Field of Search .................................. 257/209, 203, 257/207, 208, 693; 361/686, 733

(56) References Cited

U.S. PATENT DOCUMENTS

| | | | | |
|---|---|---|---|---|
| 4,679,194 | * | 7/1987 | Peters et al. | 371/16 |
| 5,983,379 | * | 11/1999 | Warren | 714/727 |
| 6,067,262 | * | 5/2000 | Irrinki et al. | 365/201 |

\* cited by examiner

*Primary Examiner*—Sara Crane
(74) *Attorney, Agent, or Firm*—Girard & Equitz LLP

(57) ABSTRACT

An integrated circuit including a plurality of connectors for communicating with circuitry within the integrated circuit, a plurality of input/output pads for connecting to external circuitry, a plurality of multiplexors joined to the connectors and the input/output pads, means for providing an external control signal for each multiplexor for joining the plurality of connectors for communicating with circuitry within the integrated circuit to correct input/output pads for connecting to external circuitry for operating the integrated circuit.

8 Claims, 2 Drawing Sheets

MULTIUSE INPUT/OUTPUT CONNECTOR ARRANGEMENT FOR GRAPHICS ACCELERATOR INTEGRATED CIRCUIT

BACKGROUND OF THE INVENTION

1. Field of the Invention

This invention relates to electronic systems and, more particularly, to methods and apparatus for providing input/output connectors capable of use with a plurality of physical connector arrangements on circuit boards.

2. History of the Prior Art

A graphics accelerator may be an integrated circuit adapted to be physically connected to a particular busing arrangement. Such an integrated circuit is typically arranged to provide input/output connections which are directly joined to busing connections on a circuit board which mounts the integrated circuit. Many graphics accelerator circuits are designed to be physically mounted to a circuit board which is adapted to be removably plugged into a slot arrangement for an input/output bus (such as the PCI or AGP buses for personal computers designed by Intel Corporation of Santa Clara, Calif.).

Circuit boards adapted to be mounted in an I/O bus slot provide a particular connection pattern to which an integrated circuit chip is typically permanently mounted. An integrated circuit chip usually has its input/output connectors designed to be mounted to a particular circuit board connection pattern which is in turn adapted to be plugged into a bus slot. The configuration of the conductors on the circuit board to which the integrated circuit must connect is controlled by the connector pattern of the slot in which the circuit board is to be placed. Consequently, the configuration of the integrated circuit input/output conductors is controlled by the connector pattern of the slot in which the circuit board is to be placed.

Instead of being physically mounted to an integrated circuit adapted to fit into an I/O bus slot, a graphics accelerator integrated circuit is sometimes mounted directly to the motherboard of a computer. In such a situation, the configuration of the integrated circuit input/output conductors is controlled by the connector pattern on the motherboard. Typically, the configuration of conductors on the motherboard to which graphics accelerator integrated circuit is mounted is different than that on a circuit board adapted to be mounted in a slot of an I/O bus. Often, the connector patterns are essentially mirror images of one another.

The consequences of this are that two individual input/output connector designs are necessary for a graphics accelerator integrated circuit which is to be placed both on a motherboard and on an I/O bus card. The requirement of different designs leads to a requirement for two different integrated circuits. This significantly increases the expense of designing and manufacturing graphics accelerator integrated circuits.

One possible way in which the same integrated circuit has been connected to a plurality of circuit boards is by modifying one or the other of the circuit boards to provide a correct interface. The typical manner in which this is accomplished is by routing the conductors on the circuit board to new positions adapted to interface with the conductor arrangement on the integrated circuit. This requires that conductors be routed over and around other conductors by the use of vias and similar arrangements. This is costly and lowers the signal integrity of the conductors.

It is desirable to eliminate the need for design and manufacture of individual integrated circuits for circuitry to be mounted to different circuit board conductor patterns without requiring cross pattern routing of connecting circuitry on circuit boards to which the integrated circuit is to be mounted.

SUMMARY OF THE INVENTION

This and other desirable objects of the present invention are accomplished by an integrated circuit including a plurality of connectors for communicating with circuitry within the integrated circuit, a plurality of input/output pads for connecting to external circuitry, a plurality of multiplexors joined to the connectors and the input/output pads, means for providing an external control signal for each multiplexor for joining the plurality of connectors for communicating with circuitry within the integrated circuit to correct input/output pads for connecting to external circuitry for operating the integrated circuit.

These and other features of the invention will be better understood by reference to the detailed description which follows taken together with the drawings in which like elements are referred to by like designations throughout the several views.

DETAILED DESCRIPTION

Figure 1:
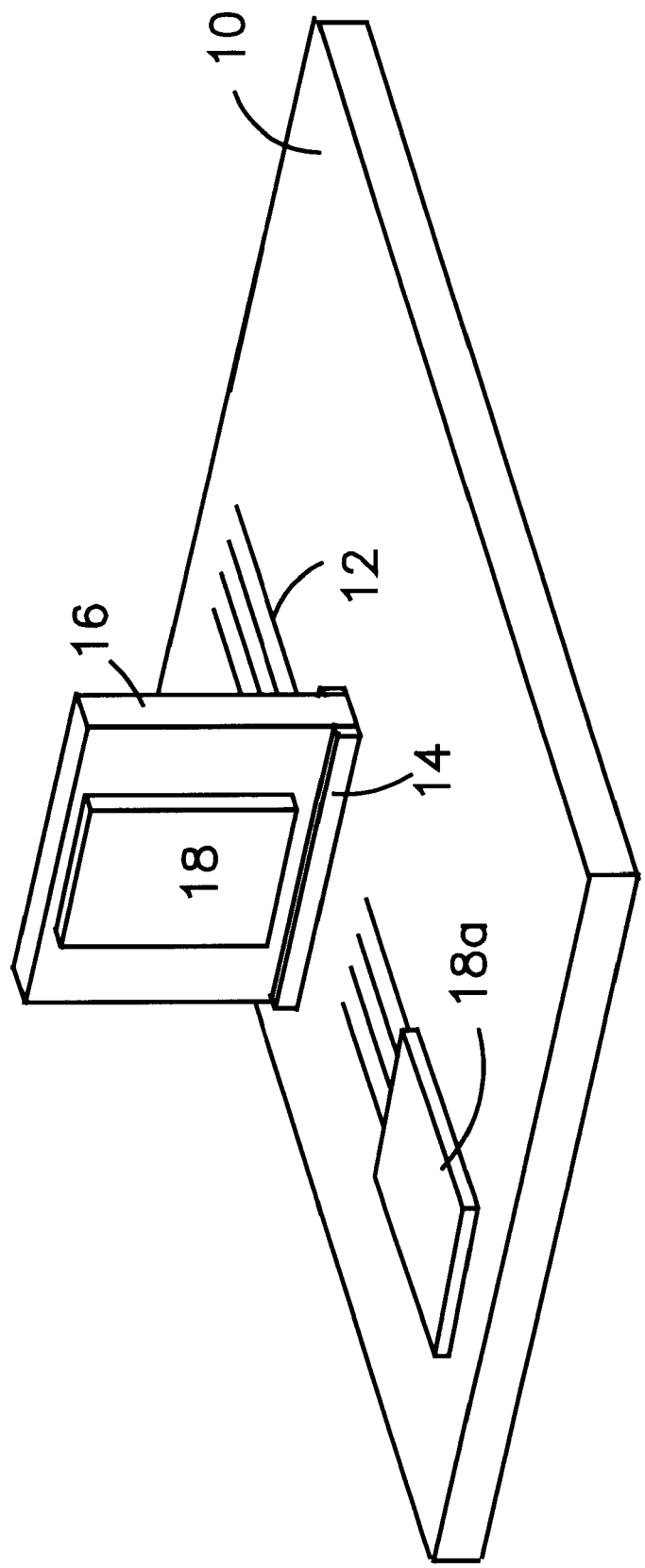
FIG. 1 is a diagram of a prior art arrangement illustrating the connection of an integrated circuit to first and second circuit boards.

FIG. 1 illustrates a first circuit board 10 such as a computer motherboard having a plurality of conductors arranged to provide a bus 12. The bus 12 may be an input/output bus such as a PCI bus or it may be a more specialized bus such as an AGP bus used for rapid transfer of graphics information. The bus 12 connects to one or more slot connectors 14 which typically provide removable access to the bus conductors. A second circuit board 16 is illustrated positioned in the slot connector 14. Such a second circuit board 16 typically provides the circuitry by which a particular computer operation is accomplished. For example, the second circuit board 16 may provide a graphics accelerator by which graphics information is presented to an external display device such as a display monitor (not shown in the figure).

One component of the circuitry of such a second circuit board 16 is often an integrated circuit chip 18 illustrated mounted to the circuit board 16. Although there are many physical ways to mount such a chip 18, input/output pads which connect to the circuitry within the integrated circuit are physically joined in some manner to conductors on the second circuit board 16; the conductors on the board 16 then provide physical connections to the conductors of the bus 12 at the slot connector 14. Typically, the input/output conductors of the integrated circuit chip 18 emerge from the integrated circuit at a plurality of pinout positions which are adapted to match the pattern of the conductors on the second circuit board 16 which join to the slot connector 14. Since the conductors on the circuit board 16 lie in some pattern, the pinout positions of the integrated circuit chip 18 are adapted to match the pattern so that the input/output conductors of the integrated circuit may join to the appropriate bus conductors through the slot connector 14.

Rather than being positioned on a second removable circuit board 16, a graphics accelerator designed as an integrated circuit such as the integrated circuit chip 18 is often placed directly on a first circuit board which is designed as a computer motherboard. Integrated circuit 18a illustrates a chip mounted to the first circuit board. Usually, the pinout positions of an integrated circuit chip designed to be mounted to a removable circuit board such as the second circuit board 16 do not match the positions of bus conductors on the first circuit board 10 (motherboard).

In order to allow the same integrated circuit to be utilized in both the positions shown for the circuit 18 and the circuit 18a, it is usually necessary to design separate integrated circuits with different pinout positions. This is expensive and undesirable. Alternatively, the conductors on one of the circuit boards leading to the pinout connectors of the integrated circuit chip may be rerouted to match the pinout positions of the integrated circuit. This usually requires that various conductors on the circuit board be routed around, over, and under other conductors on the circuit board through the use of vias, routing on multiple layers, and the like. This routing usually increases the impedance of the conductors, lowers the signal integrity, and can affect timing of high speed circuitry such as graphics accelerators.

The present invention obviates the need to design individual integrated circuits for different circuit boards while eliminating the rerouting of conductors on the circuit boards to match the pinout conductors on an integrated circuit.

Figure 2:
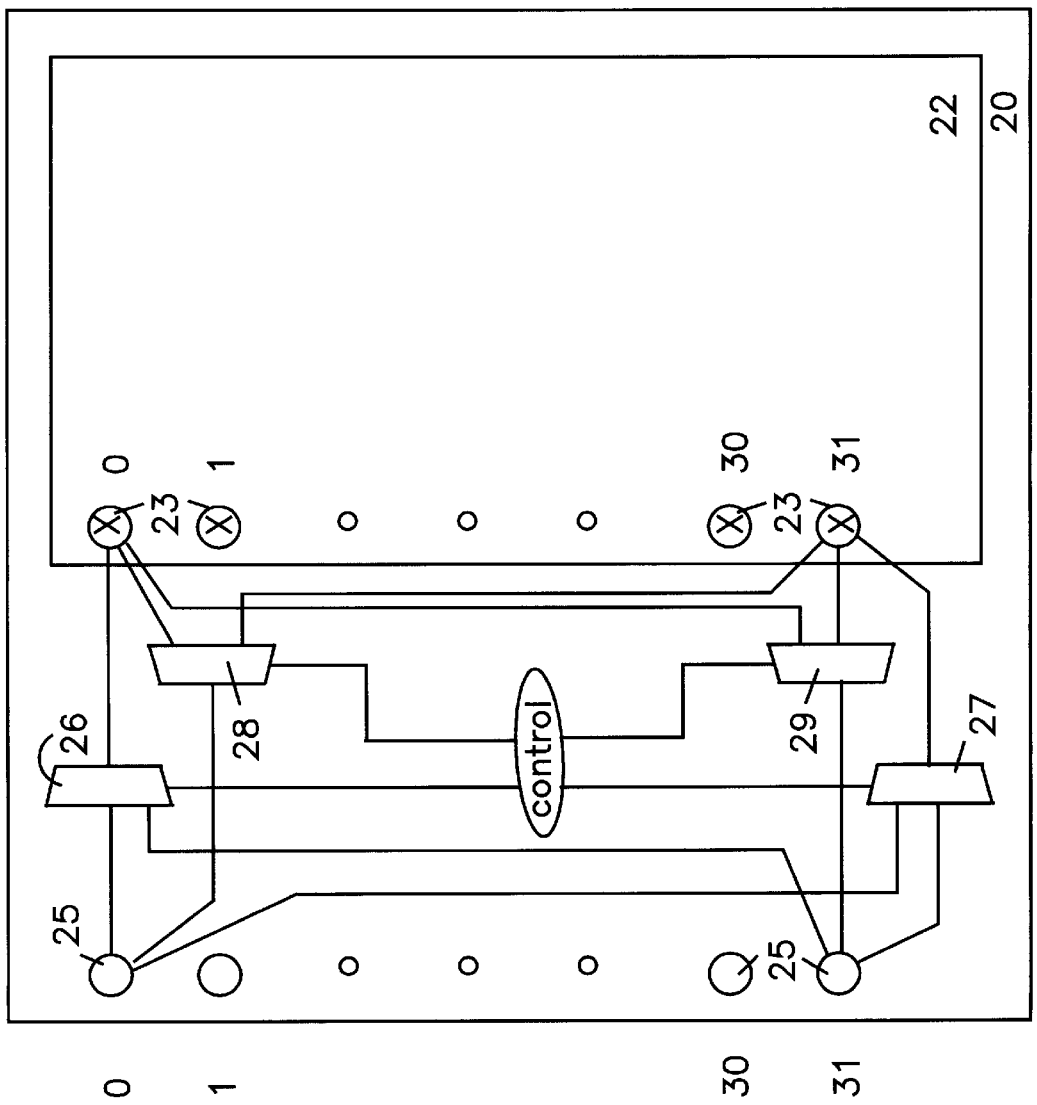
FIG. 2 is a diagram illustrating an arrangement in accordance with the present invention.

FIG. 2 illustrates an integrated circuit 20 which includes circuitry 22 the details of which are not shown because the details are not important to the present invention. Circuitry 22 may provide a graphics accelerator which assists a central processor in displaying output on a computer output display. The circuitry 22 includes a number of internal pads 23 by which input/output signals with external circuitry are provided. In prior art circuits, the pads 23 be connected to pinout positions that connect to the circuit board to which the integrated circuit 20 is physically mounted.

In order to allow a single integrated circuit to be used with different circuit boards which have different bus conductor patterns and thus provide different signals at the different pinout positions of the integrated circuit 20, the present invention provides a multiplexing arrangement between the internal pads 23 of the circuitry 22 and the external pinout positions 25 on the integrated circuit 20. Only a few of the individual multiplexors are illustrated in order to provide a clear understanding of the invention.

The internal pads 23 illustrated are numbered from 0 through 31. The pinout positions 25 are similarly numbered from 0 through 31. The numbers of each are chosen only for illustration and many more or fewer of these internal pads 23 and pinout positions 25 may be used without departing from the scope of the invention.

In the embodiment illustrated, either an input signal at a pinout numbered 0 or an input signal at a pinout numbered 31 may be selected to provide input to the internal pad numbered 0 depending on the selection accomplished by a multiplexor 26. Similarly, either an input signal at the pinout numbered 0 or an input signal at the pinout numbered 31 may be selected to provide input to the internal pad numbered 31 depending on the selection accomplished by a multiplexor 27. In a similar manner, either an output signal at the internal pad numbered 0 or an output signal at the internal pad numbered 31 may be selected to provide output to the pinout numbered 0 depending on the selection accomplished by a multiplexor 28; and either an output signal at the internal pad numbered 0 or an output signal at the internal pad numbered 31 may be selected to provide output to the pinout numbered 31 depending on the selection accomplished by a multiplexor 29. Other multiplexors (not shown) provide similar selections for the other input and output signals.

The provisions of the array of multiplexors as a part of the integrated circuit allows a selection to be made in the embodiment illustrated to fit the integrated circuit chip 20 to positions on circuits boards providing different patterns of input and output signals. The invention allows the integrated circuit to be positioned on a motherboards or a removable add-in board, for example, without designing separate integrated circuits or separate connections for the circuit boards.

In one embodiment, the multiplexors are connected to receive control input signals from the particular circuit board in order to select at system reset the internal circuit paths to be utilized. This may be accomplished through a connection to a particular voltage level on the circuit board which selects the state for each multiplexor and thus the connections of the internal pads 23 to the pinouts 25. A higher voltage might select one pattern of connections while a lower voltage selected a second pattern of connections. By utilizing more complicated signaling and providing more complicated multiplexors, selection between more than two connection conditions may be obtained so that an integrated circuit might be connected to more than two preselected physical pin positions.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. An integrated circuit comprising:
   a plurality of connectors for communicating with circuitry within the integrated circuit,
   a plurality of input/output pads for connecting to external circuitry,
   connection circuitry coupled and configured to selectively connect each of the connectors with each of the input/output pads such that each of the connectors is connected to a different one of the input/output pads, and
   control circuitry coupled and configured to respond to at least one external control signal by causing the connection circuitry to connect said each of the connectors to a different one of the input/output pads with a connection pattern determined by the at least one external control signal.

2. An integrated circuit as claimed in claim 1 in which the connection circuitry comprises a plurality of multiplexors, each of the multiplexors being coupled to the control circuitry.

3. An integrated circuit as claimed in claim 1 in which the control circuitry includes means responsive to signals from external circuitry unique to the physical arrangement of the external circuitry.

4. An integrated circuit as claimed in claim 2 in which the control circuitry asserts control signals to the multiplexors responsive to the at least one external control signal, and said at least one external control signal is a set of external control signals furnished by circuit boards providing physical connections for the input/output pads.

5. A method for allowing an integrated circuit to be physically mounted to a plurality of different physical connection configurations comprising the steps of:
   (a) providing a plurality of connectors for communicating with circuitry within the integrated circuit, (b) providing a plurality of input/output pads for connecting to external circuitry, and (c) providing connection and control circuitry configured to selectively connect the connectors to the input/output pads within the integrated circuit and operating the connection and control circuitry to connect the connectors to the input/output pads in response to a first control signal set comprising at least one external control signal, such that each of the connectors is connected to a different one of the input/output pads with a connection pattern determined by the at least one external control signal.

6. A method as claimed in claim 5 in which the connection and control circuitry includes a plurality of multiplexor circuits, wherein the at least one external control signal is a set of control signals provided by circuit boards external to the integrated circuit, and wherein step (c) includes the step of operating the connection and control circuitry in response to the first control signal set to cause the multiplexor circuits to connect said each of the connectors to said different one of the input/output pads.

7. The method of claim 5, also including the step of:

operating the connection and control circuitry to connect the connectors to the input/output pads in response to a second control signal set comprising at least one other external control signal, such that each of the connectors is connected to a different one of the input/output pads with a second connection pattern determined by the at least one other external control signal.

8. A method as claimed in claim 7, wherein the at least one external control signal is unique to a first physical configuration and the at least one other external control signal is unique to second physical configuration different from the first physical configuration.

* * * * *